(12) United States Patent
Schubert et al.

(10) Patent No.: US 10,347,609 B2
(45) Date of Patent: Jul. 9, 2019

(54) SOLID-STATE TRANSDUCER ASSEMBLIES WITH REMOTE CONVERTER MATERIAL FOR IMPROVED LIGHT EXTRACTION EFFICIENCY AND ASSOCIATED SYSTEMS AND METHODS

(75) Inventors: Martin F. Schubert, Boise, ID (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 834 days.

(21) Appl. No.: 13/464,687

(22) Filed: May 4, 2012

(65) Prior Publication Data
US 2013/0292636 A1 Nov. 7, 2013

(51) Int. Cl.
  *H01L 33/50* (2010.01)
  *H01L 33/54* (2010.01)
  *H01L 33/60* (2010.01)
  *H01L 25/075* (2006.01)

(52) U.S. Cl.
  CPC ........ *H01L 25/0753* (2013.01); *H01L 33/507* (2013.01); *H01L 33/54* (2013.01); *H01L 33/60* (2013.01); *H01L 2924/0002* (2013.01)

(58) Field of Classification Search
  USPC ...................................... 257/98, 99; 362/231
  See application file for complete search history.

(56) References Cited

U.S. PATENT DOCUMENTS

| | | | |
|---|---|---|---|
| 6,617,261 B2 | 9/2003 | Wong et al. | |
| 7,061,026 B2 * | 6/2006 | Huang | 257/103 |
| 7,687,810 B2 | 3/2010 | Mo et al. | |
| 7,842,547 B2 | 11/2010 | Shelton et al. | |
| 8,030,102 B2 | 10/2011 | Lai | |
| 2008/0291670 A1 * | 11/2008 | Rains | 362/231 |
| 2009/0296368 A1 * | 12/2009 | Ramer | 362/84 |
| 2010/0055873 A1 | 3/2010 | Yan et al. | |
| 2010/0177497 A1 * | 7/2010 | Leung et al. | 362/84 |
| 2010/0295070 A1 * | 11/2010 | Su et al. | 257/91 |
| 2011/0128718 A1 * | 6/2011 | Ramer et al. | 362/84 |

OTHER PUBLICATIONS

2301 Optical Lighting Film Technical Specification. 3M Company. Feb. 1, 2000.*

* cited by examiner

*Primary Examiner* — Stephen M Bradley
(74) *Attorney, Agent, or Firm* — Perkins Coie LLP

(57) ABSTRACT

Solid state transducer ("SST") assemblies with remote converter material and improved light extraction efficiency and associated systems and methods are disclosed herein. In one embodiment, an SST assembly has a front side from which emissions exit the SST assembly and a back side opposite the front side. The SST assembly can include a support substrate having a forward-facing surface directed generally toward the front side of the SST assembly and an SST structure carried by the support substrate. The SST structure can be configured to generate SST emissions. The SST assembly can further include a converter material spaced apart from the SST structure. The forward-facing surface and the converter material can be configured such that at least a portion of the SST emissions that exit the SST assembly at the front side do not pass completely through the converter material.

27 Claims, 5 Drawing Sheets

SOLID-STATE TRANSDUCER ASSEMBLIES WITH REMOTE CONVERTER MATERIAL FOR IMPROVED LIGHT EXTRACTION EFFICIENCY AND ASSOCIATED SYSTEMS AND METHODS

TECHNICAL FIELD

The disclosed embodiments relate to solid-state transducer ("SST") devices and methods of manufacturing SST devices. In particular, the present technology relates to SST assemblies with remote converter material for improved light extraction efficiency and associated systems and methods.

BACKGROUND

Mobile phones, personal digital assistants ("PDAs"), digital cameras, MP3 players, and other portable electronic devices utilize light-emitting diodes ("LEDs"), organic light-emitting diodes ("OLEDs"), polymer light-emitting diodes ("PLEDs"), and other SST devices for backlighting. SST devices are also used for signage, indoor lighting, outdoor lighting, and other types of general illumination. FIG. 1A, for example, is a partially schematic cross-sectional view of a conventional SST device 10a. The SST device 10a includes a carrier substrate 20 supporting an LED structure 12 that has an active region 14 (e.g., containing gallium nitride/indium gallium nitride (GaN/InGaN) multiple quantum wells ("MQWs")) between N-type gallium nitride ("N-GaN") 16 and P-type gallium nitride ("P-GaN") 18. A first contact 22 is on the P-type GaN 18 and a second contact 24 is on the N-GaN 16 such that the first and second contacts 22 and 24 are configured in a vertical arrangement on opposite sides of the LED structure 12. In other embodiments, the N-GaN 16 and the active region 14 may be recessed to expose the P-GaN 18, and the first and second contacts 22 and 24 can be spaced laterally apart from one another on forward-facing surfaces or backward-facing surfaces of the N-GaN 16 and the P-GaN. In further embodiments, the SST device 10a can include backside contacts, wherein the second contact 24 extends from the back side of the LED structure 12 into the N-GaN 16 and is electrically isolated from the first contact 22, the P-GaN 18, and the active region 14. Electrical power can be provided to the SST device 10a via the contacts 22, 24, causing the active region 14 to emit light.

The SST device 10a can be configured as a "white light" LED, which requires a mixture of wavelengths to be perceived as white by human eyes. LED structures typically only emit light at one particular wavelength (e.g., blue light), and are therefore modified to generate white light. One conventional technique for modulating the light from LED structures includes depositing a converter material (e.g., phosphor) on the LED structure. For example, as shown in FIG. 1A, a converter material 26 can be positioned over the front surface of the LED structure 12. In other conventional SST devices, such as the SST device 10b shown in FIG. 1B, the LED structure 12 can be positioned in a recessed portion 30 of the underlying carrier substrate 20, and the converter material 26 can encapsulate the LED structure 12 to fill the recessed portion 30.

In operation, the LED structures 12 of the SST devices 10a-b emit light having a certain wavelength (e.g., blue light), and the phosphor of the overlying converter material 26 absorbs some of the emitted photons. This absorption promotes the electrons of the converter material 26 to high unstable energy levels, which causes the converter material 26 to emit longer-wavelength photons (e.g., yellow light) when the electrons ultimately relax to their original state. The combination of the emissions from the LED structure 12 and the converter material 26 is designed to appear white to human eyes when the wavelengths of the emissions are matched appropriately. The generated light can be modulated by optional optical features (e.g., encapsulants or lenses 28) positioned over the converter material 26.

In both the LED devices 10a-b shown in FIGS. 1A and 1B, the converter material 26 is directly on the face of the LED structure 12, and therefore the LED emissions (e.g., blue light) must travel completely through the converter material 26 before exiting the SST device 10a-b. This trajectory through the converter material 26 decays the LED emissions, and thereby reduces the light extraction efficiency of the SST devices 10a-b. In addition, the converter material 26 spontaneously emits photons in random directions such that at least a portion of the converter emissions (e.g., about half of the converter emissions) travel inwardly toward the LED structure 12. The inward converter emissions then reflect off of the face of the LED structure 12 at least once before being extracted from the SST devices 10a-b as useful light. Each such reflection dissipates the emissions, and therefore multiple reflections decrease the light-extraction efficiency of the SST devices 10a-b.

To reduce the effects of the scattered light, the forward-facing surface of the LED structure 12 can be configured to have reflective properties. However, other considerations, such as current spreading, light-extraction efficiency, and electrical characteristics, may lead to sub-optimal reflectivity of the LED structure 12. To reduce reflections off of the face of the LED structure 12, the converter material 26 of the SST device 10b shown in FIG. 1B is configured to disperse the emissions laterally outward from the forward-facing surface of the carrier substrate 20. The surfaces of the carrier substrate 20 underlying the converter material 26 can be configured to have enhanced reflective properties without being bound by the operating constraints of the LED structure 12.

LED devices have also been designed to include a converter material spaced apart from an LED structure, such as the SST device 10c shown in FIG. 1C. The emissions reflected backward from the remote converter material 26 are less likely to hit the face of LED structure 12, and instead reflect off of other surfaces that have enhanced reflective properties. For example, the arrows shown in FIG. 1C illustrate that the emissions can reflect off of the forward-facing surface of the carrier substrate 20 and/or a larger underlying support substrate 21. However, even when the forward-facing surfaces of the substrates 20, 21 include highly reflective materials, the scattering properties of the converter material 26 still result in multiple emission-dissipating reflections before the light exits the SST device 10c. Moreover, the emissions must still pass completely through the remote converter material 26 before exiting the SST device 10c, which further reduces the light extraction efficiency of the SST device 10c.

DETAILED DESCRIPTION

Specific details of several embodiments of SST devices and assemblies with remote converter material for improved light extraction efficiency and associated systems and methods are described below. The term "SST device" generally refers to solid-state devices that include a semiconductor material as the active medium to convert electrical energy into electromagnetic radiation in the visible, ultraviolet, infrared, and/or other spectra. For example, SST devices include solid-state light emitters (e.g., LEDs, laser diodes, etc.) and/or other sources of emission other than electrical filaments, plasmas, or gases. SST devices can also include solid-state devices that convert electromagnetic radiation into electricity. The term "light extraction efficiency" generally refers to a ratio of the amount of light extracted from an SST device to the total light generated in the SST device. A person skilled in the relevant art will also understand that the technology may have additional embodiments, and that the technology may be practiced without several of the details of the embodiments described below with reference to FIGS. 2-5.

Figure 2:
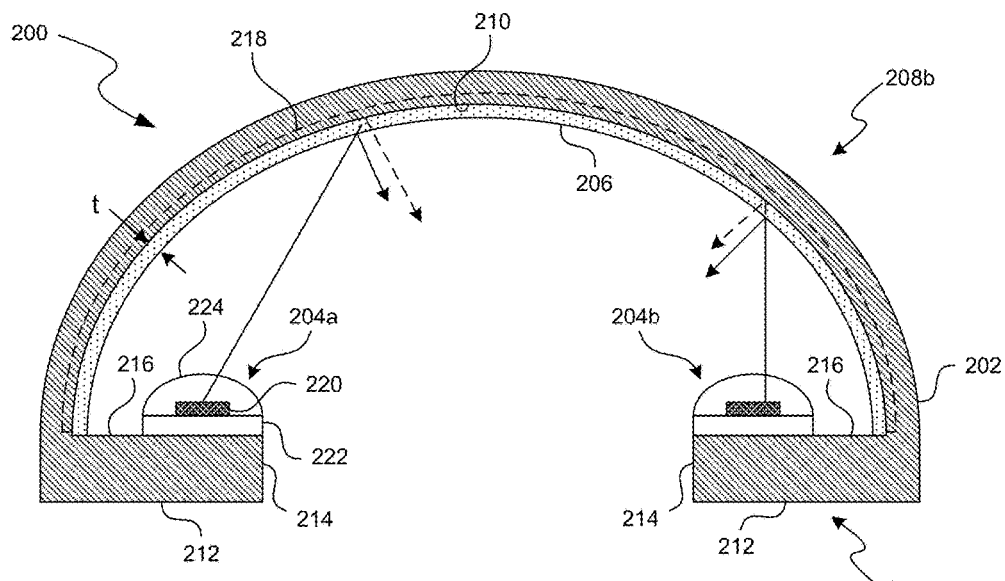
FIG. 2 is a partially schematic cross-sectional view of an SST assembly configured in accordance with embodiments of the present technology.

FIG. 2 is a partially schematic cross-sectional view of an SST assembly 200 configured in accordance with embodiments of the present technology. The SST assembly 200 includes a support substrate 202, one or more SST devices 204 (identified individually as a first SST device 204a and a second SST device 204b), and a converter material 206 spaced apart from the SST devices 204 on a forward-facing surface 210 of the support substrate 202. The SST assembly 200 has a front side 208a from which emissions from the SST devices 204 and the converter material 206 exit the SST assembly 200 and a back side 208b generally opposite the front side 208a. In the embodiment illustrated in FIG. 2, for example, the SST devices 204 face backward toward the back side 208b of the SST assembly 200 such that the SST emissions initially project generally backward toward the back side 208b of the SST assembly 200 (i.e., generally away from the front side 208a). As indicated by the arrows, at least a portion of the initial SST emissions strike the surface of the converter material 206 and reflect toward the front side 208a where they can exit the SST assembly 200 via an opening 214. Accordingly, at least a portion of the emissions from the SST devices 204 can reflect off of the surface of the converter material 206 back toward the front side 208a of the SST assembly 200, while other portions of the SST emissions can travel partially and/or fully through the thickness of the converter material 206 to the front-facing surface 210 of the support substrate 202 before being redirected toward the front side 208a of the SST assembly 200. Accordingly, the portion of the SST emissions that reflect directly from the converter material 206 and exit through the opening 214 avoid multiple reflections and other attenuation caused by first passing through the converter material 206. The SST assembly 200 can accordingly have light extraction efficiency.

In the embodiment illustrated in FIG. 2, the support substrate 202 includes a flanged portion 212 or shoulder having a support surface 216 generally facing the back side 208b of the SST assembly 200 on which the SST devices 204 can be mounted. As such, the SST emissions initially travel from the SST devices 204 toward the back side 208b of the SST assembly 200 where they strike the remote converter material 206 and/or the underlying forward-facing surface 210 before being reflected toward the front side 208a. For clarity, two SST devices 204 are shown mounted on the flanged portion 212 of the support substrate 202. However, the flanged portion 212 can extend around an inner circumference of the support substrate 202 (e.g., having a rectilinear, circular, annular, irregular, and/or other suitable shape), and can support one or more than two SST devices 204.

The forward-facing surface 210 and/or the overlying converter material 206 can be shaped to redirect the emissions generally forward toward the opening 214 in a manner that inhibits multiple reflections of the SST emissions off of other surfaces within of the SST assembly 200 and to enhance light extraction from the SST assembly 200. For example, as shown in FIG. 2, the forward-facing surface 210 can have a semi-circular cross-sectional shape that is curved toward the front side 208a of the SST assembly 200 (i.e., concave relative to the front side 208a). In other embodiments, the forward-facing surface 210 can be angled and/or otherwise shaped to direct emissions toward the opening 214.

The support substrate 202 can be made from various suitable materials for supporting one or more SST devices 204. For example, the support substrate 202 can be made from metals and/or metal alloys (e.g., copper, aluminum, aluminum nitride, etc.) that have a high thermal conductivity to function as a heat sink and thereby decrease the operating temperature of the SST assembly 200. In other embodiments, the support substrate 202 can be made from silicon, sapphire, and/or other suitable nonconductive or conductive materials.

In certain embodiments, the forward-facing surface 210 can be a highly reflective material 218 (shown in broken lines) to efficiently reflect the emissions toward the front side 208a of the SST assembly 200. The reflective material 218 can be formed on the support substrate 202 using chemical vapor deposition ("CVD"), physical vapor deposition ("PVD"), atomic layer deposition ("ALD"), plating, and/or other suitable formation techniques known in the arts. In other embodiments, the reflective material 218 can also be formed on other surfaces of the SST assembly 200 (e.g., the support surface 216), or the support substrate 202 itself can be formed from the reflective material 218. The reflective material 218 can include gold (Au), copper (Cu), silver (Ag), aluminum (Al), alloys thereof, and/or any other suitable material that reflects emissions from the SST devices 204 and/or the converter material 206. In various embodiments, the reflective material 218 can be selected based on its thermal conductivity and/or the color of light it reflects. For example, silver generally does not alter the color of the reflected light. Gold, copper, or other colored reflective materials can affect the color of the light, and can accordingly be selected to produce a desired color for the light emitted by the SST assembly 200.

Whether reflective or not, the forward-facing surface 210 can carry the converter material 206 such that the emissions (e.g., light) directed toward the back side 208b of the SST assembly 200 irradiate energized particles (e.g., electrons and/or photons) of the converter material 206. The irradiated converter material 206 can emit a light of a certain quality (e.g., color, warmth, intensity, etc.). For example, the irradiated converter material 206 can emit light having a different color (e.g., yellow light) than the light emitted by the SST devices 204 (e.g., blue light). The light emitted by the converter material 206 can combine with the light emitted by the SST devices 204 to produce a desired color of light (e.g., white light).

The converter material 206 can include a phosphor containing a doped yttrium aluminum garnet (YAG) (e.g., cerium (III)) at a particular concentration for emitting a range of colors (e.g., yellow to red) under photoluminescence. In other embodiments, the converter material 206 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium (IV)-doped YAG, dysprosium-doped YAG, samarium-doped YAG, terbium-doped YAG, and/or other suitable wavelength conversion materials. In further embodiments, the converter material 206 can include silicate phosphor, nitrate phosphor, aluminate phosphor and/or other types of salt or ester based phosphors.

In the embodiment illustrated in FIG. 2, the converter material 206 at least generally conforms to the forward-facing surface 210 and has an at least generally uniform thickness, and therefore has a generally semi-circular shape in FIG. 2. The conformal converter material 206 can have a thickness such that more emissions reflect from the surface of the converter material 206 than pass through it. In other embodiments, the converter material 206 can have other suitable cross-sectional shapes and configurations with respect to the underlying forward-facing surface 210 and/or other surfaces of the SST assembly 200. For example, the shape of the forward-facing surface 210 and the converter material 206 can be optimized with respect to the positioning of the SST devices 204 to avoid SST emissions (e.g., blue light) from exiting the SST assembly 200 before striking the converter material 206. In other embodiments, the converter material 206 can have a non-uniform thickness at selected areas of the forward-facing surface 210 to control the color of light at selected areas of the opening 214. The converter material 206 can be formed on the forward-facing surface 210 using CVP, PVD, ALD, and/or other suitable deposition methods known in the art.

As discussed above, the remotely-positioned converter material 206 is not in direct contact with the SST devices 204, nor do all of the emissions from the SST devices 204 penetrate into or otherwise pass completely through the converter material 206. The converter material 206 therefore experiences less heating from the SST devices 204, which allows for the use of alternative converter materials that may be sensitive to the operating temperatures induced by conventional SST devices. For example, the SST assembly 200 can include organic converter materials, high refractive index silicone, and/or other suitable converter materials that may have heat-sensitive properties. The lower temperatures in the converter material 206 may also increase the operating life of the converter material 206, enhance the efficiency of the converter material 206, and/or may enhance the control over the color of light (i.e., the mixture of wavelengths) emitted by the SST assembly 200.

The individual SST devices 204 can include an SST structure 220 carried by a substrate 222. The substrate 222 can be comprised of generally similar materials as the support substrate 202 (e.g., polymers, silicon, metals, metal allows, etc.) and/or other suitable substrate materials. The SST structure 220 can be formed using metal organic chemical vapor deposition ("MOCVD"), molecular beam epitaxy ("MBE"), liquid phase epitaxy ("LPE"), and/or hydride vapor phase epitaxy ("HVPE"), and/or other suitable epitaxial growth techniques known in the arts. In certain embodiments, the SST structure 220 can be formed on a growth substrate and subsequently attached to the substrate 222. In other embodiments, the SST structure 220 can be formed directly on the substrate 222, and therefore the substrate 222 can be made from sapphire and/or other suitable materials for growth substrates. In further embodiments, the substrate 222 can be omitted, and the SST structure 220 can be mounted directly on support substrate 202 (e.g., using a chip-on-board approach).

The SST structure 220 can include an active region between two semiconductor materials. For example, a first semiconductor material can include a P-type semiconductor material (e.g., a P-type gallium nitride ("P-GaN")), and a second semiconductor material can include an N-type semiconductor (e.g., an N-type gallium nitride ("N-GaN")). In selected embodiments, the first and second semiconductor materials can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials. The active region can include a single quantum well ("SQW"), MQWs, and/or a bulk semiconductor material. The term "bulk semiconductor material" generally refers to a single grain semiconductor material (e.g., InGaN) with a thickness between approximately 10 nanometers and approximately 500 nanometers. In certain embodiments, the active region can include an InGaN SQW, GaN/InGaN MQWs, and/or an InGaN bulk material. In other embodiments, the active region can include aluminum gallium indium phosphide (AlGaInP), aluminum gallium indium nitride (AlGaInN), and/or other suitable materials or configurations. In certain embodiments, the SST structure 220 can be configured to emit light in the visible spectrum (e.g., from about 390 nm to about 750 nm), in the infrared spectrum (e.g., from about 1050 nm to about 1550 nm), and/or in other suitable spectra.

As further shown in FIG. 2, the individual SST devices 204 can optionally include a cover feature 224, such as a lens or encapsulant that transmits emissions generated by the SST structure 220. The cover features 224 can be made from a transmissive material including silicone, polymethylmethacrylate (PMMA), resin, or other suitable transmissive materials. In the embodiment illustrated in FIG. 2, the cover features 224 have a generally hemispherical shape. In other embodiments, the cover features 224 can have different shapes to collimate, scatter, and/or otherwise modulate light or other emissions from the SST structure 220. For example, in several embodiments, the cover features 224 can be configured to direct emissions from the underlying SST structure 220 toward the forward-facing surface 210 or a specific portion thereof to encourage reflection toward the opening 214 at the front side 208a of the SST assembly 200.

Figure 1A:
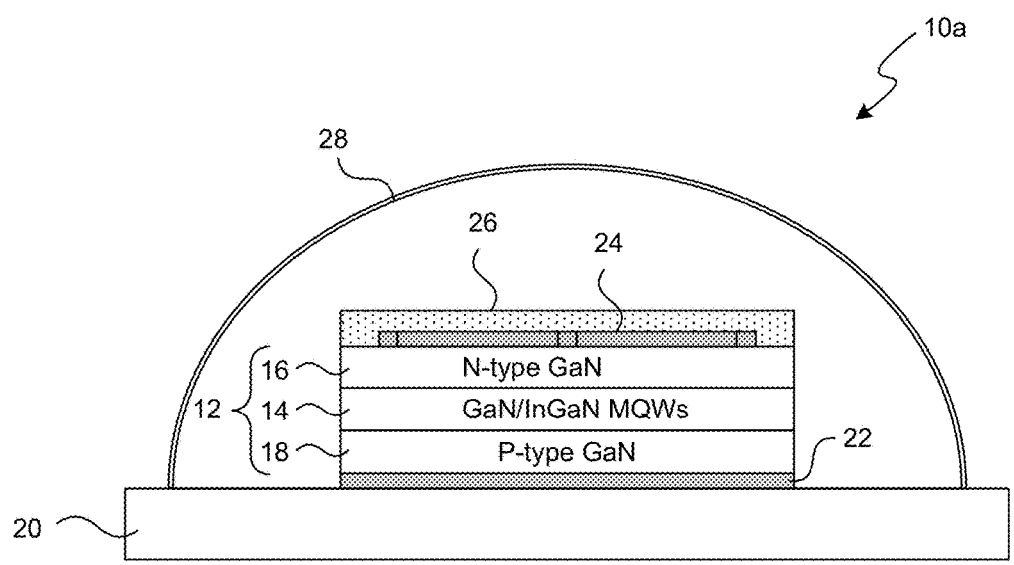
FIG. 1A is a partially schematic cross-sectional diagram of an SST device configured in accordance with the prior art.
Figure 1B:
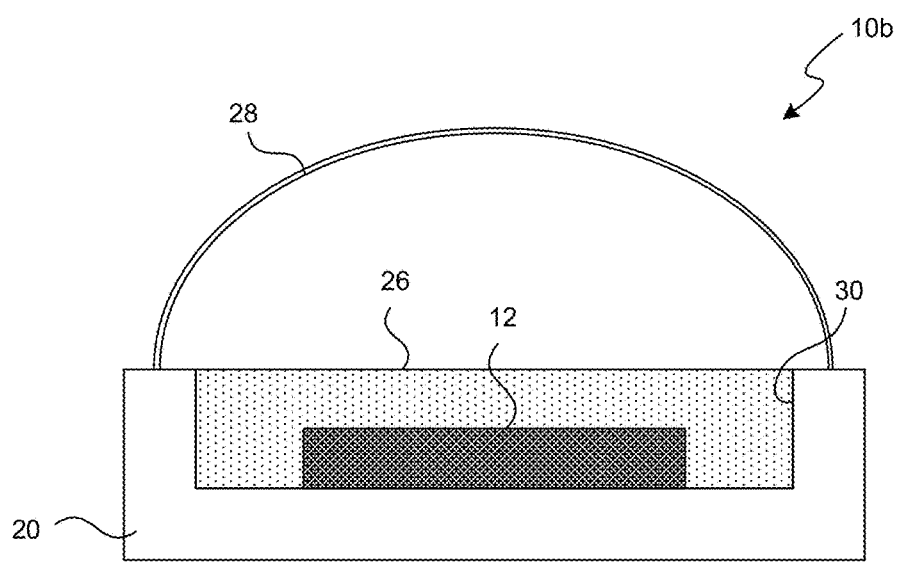
FIG. 1B is a partially schematic cross-sectional diagram of an SST device configured in accordance with another embodiment of the prior art.
Figure 1C:
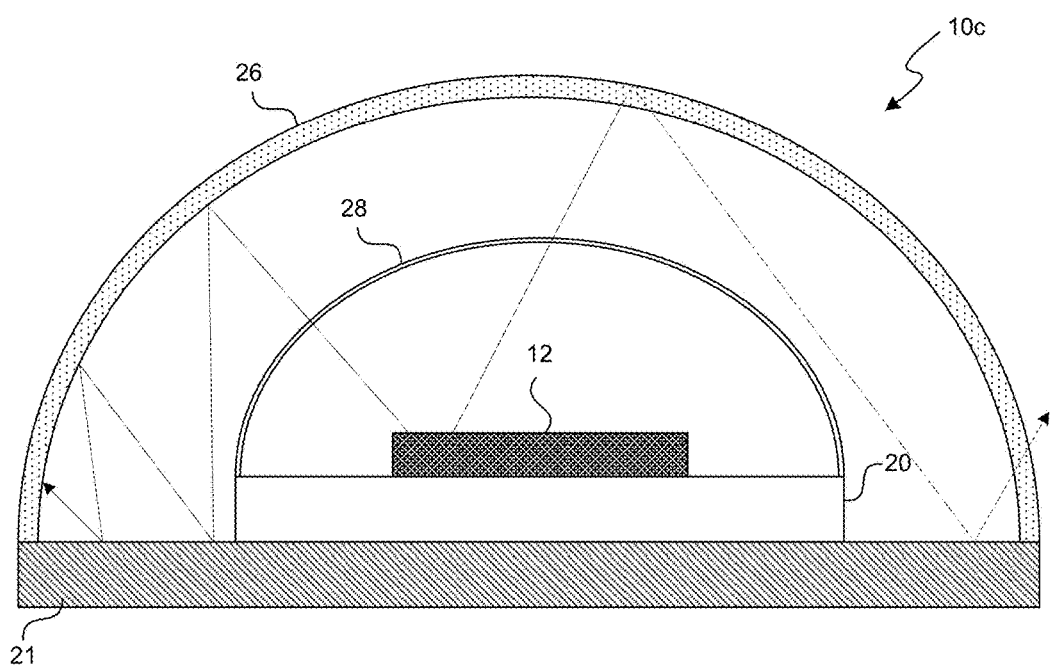
FIG. 1C is a partially schematic cross-sectional diagram of an SST device configured in accordance with yet another embodiment of the prior art.

Several embodiments of the SST assembly 200 shown in FIG. 2 can have enhanced light extraction efficiencies. As explained above with reference to FIGS. 1A-1C, conventional SST devices may be inefficient because, among other reasons, the emissions from the SST structure must travel completely through a converter material (e.g., phosphor) before exiting the device, which dissipates the emissions. Additionally, the randomized dispersion of photons from the converter material can result in multiple reflections of the emissions from various surfaces of the SST device, resulting in further dissipation of the emissions and a decrease in the extraction efficiency. For example, the emissions of a conventional SST device with a remotely-positioned converter material may incur on average 7 or more reflections before exiting the SST device. Even assuming that the SST device includes highly reflective surfaces (e.g., 97% reflectivity with only 3% of the emissions lost upon each reflection), the multiple reflections still result in substantial emission losses (e.g., 19%). In a conventional SST device having a luminous efficacy of radiation of 330 lm/W and an average photon energy of the final spectrum of about 82% (e.g., as in some conventional remote-converter material SST devices), the SST device would deliver approximately 220 lm/W luminous efficacy from the SST structure.

The SST assembly 200 shown in FIG. 2 avoids the problems of conventional SST devices by spacing or otherwise locating the converter material 206 apart from the SST structure 220 such that at least a portion of the emissions of the SST assembly 200 do not pass completely through the thickness of the converter material 206 before being extracted from the SST assembly 200. Instead, the surface of the converter material 206 reflects incident SST emissions and, in certain embodiments, may reflect more SST emissions than the other surfaces of the SST assembly 200 (e.g., the forward-facing surface 210). Intermediate portions of the converter material 206 may also direct some of the SST emissions toward the opening 214 before the SST emissions pass completely through the full thickness of the converter material 206. The SST emissions reflected off of the converter material 206 do not dissipate as they would if they were to travel completely through the full thickness "t" of the converter material 206, and are therefore not subject to the randomized dispersion of emissions that results in multiple reflections. The fraction of the SST emissions that passes completely through the full thickness "t" of the converter material 206 is reflected by the underlying forward-facing surface 210. The shape of the forward-facing surface 210, along with the reflective material 218 on the forward-facing surface 210, can direct the emissions toward the front side 208a of the SST assembly 200 where they can be extracted through the opening 214. These emissions from the SST assembly 200 are therefore less prone to multiple reflections that dissipate the extraction efficiency. Even assuming that the SST emissions would incur an average of two reflection events, the SST assembly 200 (e.g., having a luminous efficacy of radiation of 330 lm/W) would still deliver about 255 lm/W luminous efficacy, which is an improvement of 16% over conventional remote-converter material devices.

Figure 3:
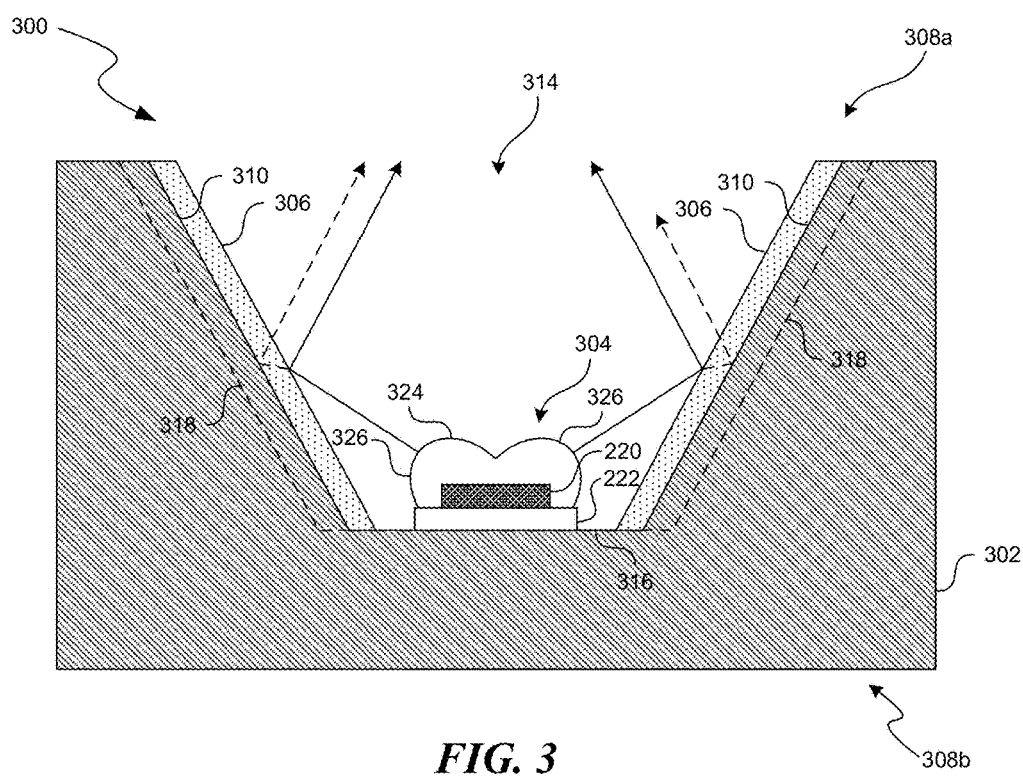
FIG. 3 is a partially schematic cross-sectional view of an SST assembly configured in accordance with other embodiments of the present technology.

FIG. 3 is a partially schematic cross-sectional view of an SST assembly 300 configured in accordance with other embodiments of the present technology. The SST assembly 300 can include features generally similar to the features of the SST assembly 200 described with reference to FIG. 2. For example, the SST assembly 300 can include an SST device 304 carried by a support surface 316 of a support substrate 302, forward-facing surfaces 310 made from and/or coated with a reflective material 318, and a converter material 306 on the forward-facing surfaces 310.

In the embodiment illustrated in FIG. 3, the forward-facing surfaces 310 extend at an angle from the support surface 316 toward a front side 308a of the SST assembly 300. Rather than facing a back side 308b of the SST assembly 300, the SST device 304 shown in FIG. 3 faces generally toward an opening 314 of the support substrate 302 at the front side 308a of the SST assembly 300. However, the SST emissions do not radiate directly forward through the opening 314. Instead, as shown in FIG. 3, a cover feature 324 can be positioned over the SST structure 220 and configured to direct the SST emissions generally toward the converter material 306 on the forward-facing surfaces 310 of the support substrate 302 such that at least a portion of the SST emissions strike the converter material 306 before exiting the SST assembly 300. In the illustrated embodiment, for example, the cover feature 324 includes at least two lobes 326 that concentrate and direct the SST emissions radially outward toward the forward-facing surfaces 310. At least a portion of the emissions can reflect off of the angled converter material 306 and exit the SST assembly 300 without incurring multiple reflections or dissipating as they travel into the converter material 306. As discussed above, the remotely-positioned converter material 306 can be comprised of a broad range of materials, such as heat-sensitive converter materials, because the converter material 306 is not directly heated by the SST device 304. A portion of the SST emissions that passes through the complete thickness of the converter material 306 can reflect off of the underlying reflective material 318. Because the forward-facing surfaces 310 are spaced apart from the SST device 304, they are not constrained by the operating parameters of the SST device 304 and can therefore be optimized for reflectivity. In other embodiments, the converter material 306 and/or the underlying support substrate 302 can have other suitable shapes and configurations for extracting emissions from the SST assembly 300 without the emissions completely passing through the converter material 306, and the cover feature 324 can be designed for the specific configuration of the converter material 306.

Figure 4:
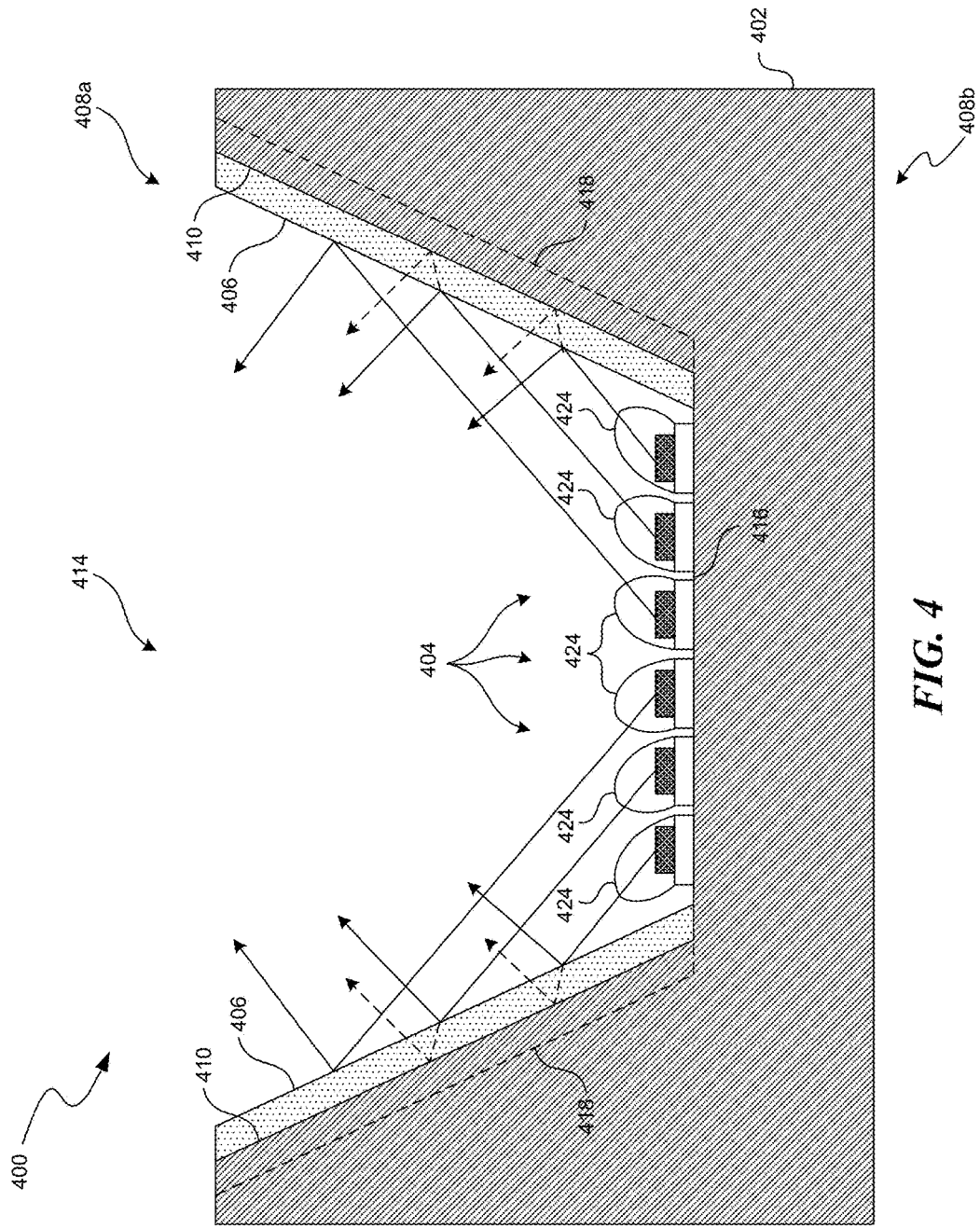
FIG. 4 is a partially schematic cross-sectional view of an SST assembly configured in accordance with further embodiments of the present technology.

FIG. 4, for example, is a partially schematic cross-sectional view of an SST assembly 400 configured in accordance with further embodiments of the present technology. The SST assembly 400 includes features generally similar to the features of the SST assembly 300 described with reference to FIG. 3. However, the SST assembly 400 includes a plurality of SST devices 404 positioned next to one another on a support surface 416 of a support substrate 402. Each SST device 404 includes a cover feature 424 that directs the SST emissions of the individual SST devices 404 toward a forward-facing surface 410 positioned proximate to the individual SST devices 404. In certain embodiments, the SST devices 404 can be arranged in a rectilinear array on the support surface 416, and the forward-facing sidewalls 410 can extend from the support surface 416 in a similar rectilinear pattern. The cover features 424 can be configured to direct SST emissions toward the closest sidewall 410. In other embodiments, the forward-facing surfaces 410 can extend from the support surface 416 to form a blunt cone shape or a hemispherical shape, and the SST devices 404 can be configured in a circular array with the cover features 424 directing the SST emissions radially outward. In further embodiments, the forward-facing surfaces 410, the converter material 406, and/or the support substrate 402 can have other suitable configurations that allow emissions from the SST devices 404 to strike the converter material 406 without penetrating completely through it before exiting the SST assembly 400.

Figure 5:
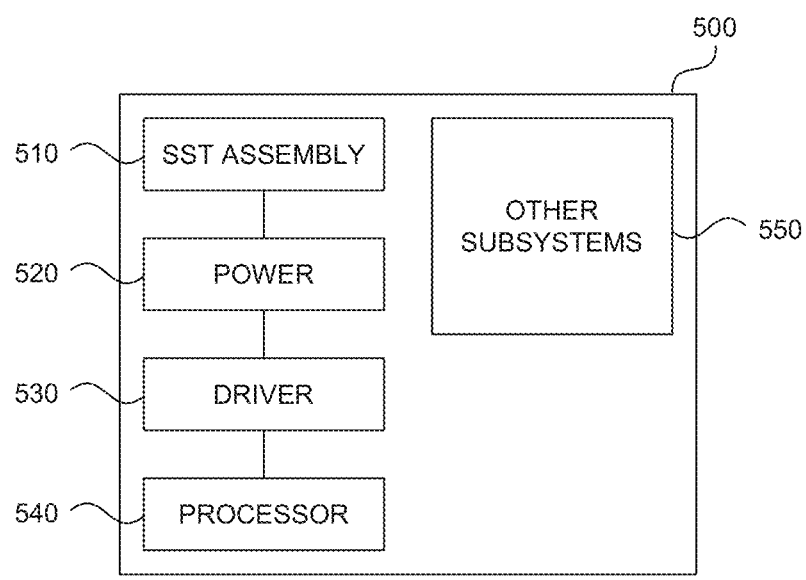
FIG. 5 is a schematic view of a system that incorporates an SST assembly in accordance with embodiments of the present technology.

Any one of the SST assemblies described above with reference to FIGS. 2-4 can be incorporated into any of a myriad of larger and/or more complex systems, a representative example of which is system 500 shown schematically in FIG. 5. The system 500 can include an SST assembly 510, a power source 520, a driver 530, a processor 540, and/or other subsystems or components 550. The resulting system 500 can perform any of a wide variety of functions, such as backlighting, general illumination, power generations, sensors, and/or other suitable functions. Accordingly, representative systems 500 can include, without limitation, hand-held devices (e.g., mobile phones, tablets, digital readers, and digital audio players), lasers, photovoltaic cells, remote controls, computers, and appliances. Components of the system 500 may be housed in a single unit or distributed over multiple, interconnected units (e.g., through a communications network). The components of the system 500 can also include local and/or remote memory storage devices, and any of a wide variety of computer readable media.

From the foregoing, it will be appreciated that specific embodiments of the technology have been described herein for purposes of illustration, but that various modifications may be made without deviating from the disclosure. For example, in FIGS. 2-4, the SST devices individually include an SST structure mounted on a carrier substrate, which is in turn mounted on the underlying support surface of the support substrate. However, in other embodiments, the SST structures can be mounted directly on the support substrate of the SST assemblies using a chip-on-board approach and/or other suitable formation. Additionally, the illustrated embodiments are only representative examples of the suitable support substrate configurations for SST assemblies in accordance with the present technology. Other embodiments of SST assemblies can include support substrates having other suitable shapes that allow SST emissions to exit the SST assembly without fully passing through a converter material. Certain aspects of the new technology described in the context of particular embodiments may be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A solid-state transducer (SST) assembly having a front side from which emissions exit the SST assembly and a back side opposite the front side, the SST assembly comprising:
   a support substrate having a forward-facing surface and an opening from which emissions exit the SST assembly;
   an SST structure carried by the support substrate and configured to generate SST emissions; and
   a wavelength converter material spaced apart from the SST structure, the wavelength converter material having a thickness, wherein the forward-facing surface and the wavelength converter material are configured such that at least a portion of the SST emissions that exit the SST assembly at the front side do not pass completely through the thickness of the wavelength converter material, wherein the thickness of the wavelength converter material is such that more SST emissions reflect from an outer surface of the wavelength converter material than pass through the wavelength converter material.

2. The SST assembly of claim 1 wherein:
   the support substrate includes a flanged portion at an inner circumference of the support substrate, the flanged portion having a support surface carrying the SST structure, wherein the support surface and the SST structure face generally toward the back side of the SST structure;
   the forward-facing surface extends from the flanged portion toward the back side of the SST assembly, the forward-facing surface being shaped to direct SST emissions through the opening;
   the forward-facing surface includes a reflective material;
   the wavelength converter material is on the reflective material at the forward-facing surface; and
   the SST structure includes a first semiconductor material comprising N-type gallium nitride (N-GaN), a second semiconductor material comprising a P-type gallium nitride (P-GaN), and an active region comprising indium gallium nitride (InGaN), the active region being between the first and second semiconductor materials.

3. The SST assembly of claim 1 wherein:
   the SST structure faces generally toward the back side of the SST assembly;
   the forward-facing surface is positioned toward the back side of the SST assembly relative to the SST structure;
   the wavelength converter material is on the forward-facing surface; and
   the SST assembly is configured such that the SST emissions initially travel generally toward the back side of the SST assembly where at least a portion of the SST emissions strike the outer surface of the wavelength converter material and reflect toward the front side to exit the SST assembly.

4. The SST assembly of claim 3 wherein the forward-facing surface has a substantially semicircular cross-sectional shape.

5. The SST assembly of claim 1 wherein:
   the support substrate includes a support surface that carries the SST structure and faces generally toward the front side of the SST assembly;
   the forward-facing surface is spaced laterally outward from the support surface and is angled toward the front side;
   the forward-facing surface comprises a reflective material;
   the converter material is on the reflective material of the forward-facing surface; and
   the SST assembly further includes a cover feature on the SST structure, the cover feature being configured to direct at least a portion of the SST emissions generally toward the forward-facing surface.

6. The SST assembly of claim 1, further comprising a cover feature on the SST structure, the cover feature being shaped to direct SST emissions generally toward the forward-facing surface.

7. The SST assembly of claim 6 wherein the cover feature comprises a first lobe configured to direct a first portion of the SST emissions laterally outward in a first direction and a second lobe configured to direct a second portion of the SST emissions laterally outward in a second direction different from the first direction.

8. A solid-state transducer (SST) assembly having a front side from which emissions exit the SST assembly and a back side opposite the front side, the SST assembly comprising:

a support substrate having a forward-facing surface and an opening from which emissions exit the SST assembly, wherein the forward-facing surface comprises a reflective material;

an SST structure carried by the support substrate and configured to generate SST emissions;

a wavelength converter material spaced apart from the SST structure, the wavelength converter material having a thickness, wherein the forward-facing surface and the wavelength converter material are configured such that at least a portion of the SST emissions that exit the SST assembly at the front side do not pass completely through the thickness of the wavelength converter material, wherein the thickness of the wavelength converter material is such that more SST emissions reflect from an outer surface of the wavelength converter material than pass through the wavelength converter material; and wherein the wavelength converter material is on the reflective material of the forward-facing surface.

9. The SST assembly of claim 1 wherein the wavelength converter material comprises a phosphorous material.

10. A solid state transducer (SST) assembly having a front side from which emissions exit the SST assembly and a back side opposite the front side, the SST assembly comprising:

a support substrate having a surface generally facing the front side of the SST assembly;

a wavelength converter material on the surface and configured to produce converter emissions, wherein the converter material has a thickness; and at least one SST structure carried by the support substrate and separated from the wavelength converter material, the at least one SST structure being configured to generate SST emissions, wherein at least a portion of the SST emissions are directed generally toward the wavelength converter material and pass through less than the complete thickness of the wavelength converter material before exiting the SST assembly, wherein the thickness of the wavelength converter material is configured such that more of the SST emissions reflect off of a forward-facing surface of the wavelength converter material and exit the SST assembly without passing through wavelength converter material than pass completely through the wavelength converter material, and wherein the wavelength converter material and the surface of the support substrate are configured to reflect SST and converter emissions toward the front side of the SST assembly.

11. The SST assembly of claim 10 wherein at least a portion of the SST emissions strike the wavelength converter material traveling in a direction substantially opposite of the direction in which the emissions exit the SST assembly.

12. The SST assembly of claim 10 wherein:

the at least one SST structure faces generally toward the back side of the SST assembly; and the wavelength converter material is positioned toward the back side of the SST assembly with respect to the SST structures.

13. The SST assembly of claim 10 wherein the surface is reflective, and wherein the wavelength converter material is conformal to the surface.

14. The SST assembly of claim 11 wherein the surface and the wavelength converter material are angled and/or curved toward the front side of the SST assembly.

15. The SST assembly of claim 10 wherein the surface and the wavelength converter material are configured such that the SST emissions strike the wavelength converter material before exiting the SST assembly.

16. The SST assembly of claim 10, further comprising a cover feature over the at least one SST structure, wherein the cover feature is configured to direct the SST emissions generally toward the wavelength converter material before the SST emissions exit the SST assembly.

17. The SST assembly of claim 10 wherein the wavelength converter material has an outer surface, and wherein at least a portion of the SST emissions reflect once from the outer surface before exiting the SST assembly.

18. A lighting system comprising:

a solid-state transducer (SST) assembly having a front side and a back side opposite the front side, the SST assembly comprising— a support substrate having a forward-facing surface and an opening from which emissions exit the SST assembly, the opening being at the front side;

an SST structure carried by the support substrate and configured to generate light; and a converter material spaced apart from the SST structure on the forward-facing surface, the converter material having a thickness, wherein the forward-facing surface and the converter material are configured such that at least a portion of the light that exits the SST assembly at the front side does not pass completely through the thickness of the converter material, wherein the thickness of the wavelength converter material is such that more light reflects off an outer surface of the wavelength converter material than passes through the wavelength converter material, and wherein the converter material is configured to change the wavelength of the light emitted by the SST structure; and a driver operably coupled to the SST assembly.

19. The lighting system of claim 18 wherein the light emitted by the SST structure initially travels generally toward the back side of the SST assembly before being reflected toward the front side by the converter material and/or the forward-facing surface.

20. The lighting system of claim 18 wherein:

the forward-facing surface comprises a reflective material; and the converter material is on at least a portion of the reflective material.

21. The lighting system of claim 18 wherein:

the SST structure faces generally toward the front side of the SST assembly; and the forward-facing surface and the converter material are spaced laterally outward from the SST structure and is angled and/or curved toward the front side.

22. The lighting system of claim 18 wherein the SST assembly further includes a cover feature on the SST structure, the cover feature being configured to direct at least a portion of the light emitted by the SST structure generally toward the forward-facing surface.

23. A light emitting diode (LED) assembly having a front side from which light exits the LED assembly and a back side opposite the front side, the LED assembly comprising:

a support substrate having a forward-facing surface generally facing the front side of the LED assembly;

a wavelength converter material on the forward-facing surface of the support substrate and having a thickness;

an LED structure carried by the support substrate and spaced apart from the wavelength converter material, the LED structure being configured to generate light directed generally toward the wavelength converter material, wherein at least a portion of the light that exits the LED assembly at the front side does not pass completely through the thickness of the wavelength converter material, and wherein the thickness of the wavelength converter material is such that more light reflects off of an outer surface of the wavelength converter material than passes through the wavelength converter material.

24. The LED assembly of claim 23 wherein:

the forward-facing surface includes a reflective material; and the wavelength converter material is on the reflective material at the forward-facing surface.

25. The LED assembly of claim 23 wherein:

the LED structure faces generally toward the back side of the LED assembly;

the forward-facing surface is positioned toward the back side of the LED assembly relative to the LED structure; and the LED assembly is configured such that the light from the LED structure initially travels generally toward the back side of the LED assembly where the light strikes an outer surface of the wavelength converter material and reflects toward the front side to exit the LED assembly.

26. The LED assembly of claim 23 wherein:

the LED structure faces generally toward the front side of the LED assembly the forward-facing surface is spaced laterally outward from the LED structure; and the LED assembly further includes a cover feature on the LED structure, the cover feature being configured to direct at least a portion of the light from the LED structure generally toward the forward-facing surface.

27. The LED assembly of claim 23, further comprising a cover feature on the LED structure, the cover feature being shaped to direct light from the LED structure generally toward the forward-facing surface.

* * * * *